United States Patent [19]

Cole, Jr. et al.

[11] Patent Number: 4,865,873
[45] Date of Patent: Sep. 12, 1989

[54] ELECTROLESS DEPOSITION EMPLOYING LASER-PATTERNED MASKING LAYER

[75] Inventors: Herbert S. Cole, Jr., Scotia; Lionel M. Levinson, Schenectady; Yung S. Liu; Theresa A. Sitnik, both of Scotia, all of N.Y.

[73] Assignee: General Electric Company, Schenectady, N.Y.

[21] Appl. No.: 129,854

[22] Filed: Dec. 7, 1987

Related U.S. Application Data

[63] Continuation of Ser. No. 907,280, Sep. 15, 1986, abandoned.

[51] Int. Cl.⁴ .......................... B05D 5/12; B05D 3/06; B05D 3/04
[52] U.S. Cl. .......................... 427/53.1; 427/98; 427/271; 427/304; 427/305
[58] Field of Search ................ 427/98, 271, 304, 305, 427/306, 53.1, 54.1

[56] References Cited

U.S. PATENT DOCUMENTS

| | | | |
|---|---|---|---|
| 4,202,914 | 5/1980 | Havas et al. | 427/38 |
| 4,204,009 | 5/1980 | Feng et al. | 427/53.1 |
| 4,264,646 | 4/1981 | Thornburg | 427/305 |
| 4,268,610 | 5/1981 | Roos | 427/98 |
| 4,414,059 | 11/1983 | Blum et al. | 427/53.1 |
| 4,574,095 | 3/1986 | Baum et al. | 427/53.1 |
| 4,707,378 | 11/1987 | McBride et al. | 427/8 |

FOREIGN PATENT DOCUMENTS

0180101 7/1986 European Pat. Off. .
0136471 8/1984 Japan ..................................... 427/98

OTHER PUBLICATIONS

IBM Research Highlights, "Heatless Laser Etching", Nov. 3, 1983.
J. Vac. Sci. Technol., B(3), May/Jun., 1985, pp. 913–917.
J. App. Phys., 57(4), Feb. 15, 1985.
J. Vac. Sci. Technol., B1(4), Oct.–Dec., 1983.
N. Feldstein, "Selective Electroless Plating Techniques: A Survey", Plating, Aug., 1970, pp. 803–806.
D. J. Sharp, "Photoselective Metal Deposition", Plating, Aug., 1971, pp. 103–121.
Li et al., Applied Physics Letters, 46 (10), May 15, 1985, pp. 997–999.

Primary Examiner—Norman Morgenstern
Assistant Examiner—Margaret Bueker
Attorney, Agent, or Firm—Marvin Snyder; James C. Davis, Jr.

[57] ABSTRACT

A metal is electrolessly plated on a substrate which is first coated with at least one ablatively-removable layer that is selectively irradiated with laser radiation to obtain a pattern for the deposition of metal on the substrate. The electroless plating solution applied to the substrate after the irradiated substrate is coated with a catalyst also serves to remove the unirradiated portion of the ablatively-removable layer. The method is particularly suited for plating fine lines of metal, especially on non-planar surfaces.

29 Claims, 4 Drawing Sheets

ELECTROLESS DEPOSITION EMPLOYING LASER-PATTERNED MASKING LAYER

This application is a continuation of application Ser. No. 907,280, filed Sept. 15, 1986 and now abandoned.

FIELD OF THE INVENTION

The present invention is directed to a process for electrolessly plating metal on a substrate by exposing at least a portion of the substrate to laser radiation and to products produced thereby. The present process provides high resolution metal plating, making it especially suited for plating non-planar surfaces.

Background of the Invention

Selective electroless plating of metals has long been known for the fabrication of electronic components such as printed circuit boards and semiconductor devices. The most common technique involves sensitizing the surface of the substrate (e.g., with stannous chloride) followed by activation with a palladium catalyst such as palladium chloride prior to electroless deposition. A summary of photoselective deposition methods are disclosed in *Plating*, Aug. 1970, pp. 803–806 "Selective Electroless Plating Techniques: A Survey", N. Feldstein and *Plating*, Aug., 1971, pp. 103–121 "Photoselective Metal Deposition", D. J. Sharp.

In order to carry out selective plating, patterns of catalytic nuclei must be provided on the substrate surface, which typically involves masking portions of the surface to differentiate areas to be plated from areas which are not to be plated. Such masking operations are carried out on essentially flat surfaces using materials such as photoresists, inks and the like. However, with recent developments in the fabrication of printed circuit boards and semiconductor devices it is now desirable to plate non-planar surfaces. Currently, it is exceedingly difficult to plate raised and rounded surfaces using conventional technology which employs planar masks.

Masks are also disadvantageous because a new mask must be made every time there is a change in the plating pattern. This makes it difficult and costly to manufacture small quantities of printed circuit devices and semiconductor devices.

Recently it has been established that lasers can be employed to ablatively photodecompose polymeric substances by breaking carbon-carbon bonds to produce exceedingly sharp cuts. See, *IBM Research Highlights*, "Heatless Laser Etching", Nov. 3, 1983. Further work in this area has shown that lasers, and particularly excimer lasers, emit radiation in the ultraviolet region in which the depth of cut is dependent on several factors including the fluence ($mJ/cm^2$) applied to the surface to be cut. (*J.Vac.Sci.Technol.*, May/June 1985, pp. 913–917; *J.App.Phys.* 57(4), Feb. 15, 1985, pp. 1420–1422; and *J.Vac.Sci.Technol.*, Oct.-Dec., 1983, pp. 923–925, incorporated herein by reference.)

Lasers of the type described above, especially excimer lasers, can be usefully employed in a process for producing electronic circuitry which eliminates the use of masks and provides sharp cuts having a width in the micron region.

It is therefore an object of the invention to provide a photoselective metal deposition process in which fine lines can be plated on a substrate, even on raised and/or rounded surfaces.

It is a further object of the invention to provide a photoselective metal deposition process in which use of conventional masks is eliminated.

It is a still further object of the invention to provide a photoselective metal deposition process in which it is relatively simple to change the deposition pattern as the substrate is being plated.

It is another object of the invention to provide metal plated substrates having fine lines of metal deposited thereon, which are useful for the production of printed circuits, semiconductor devices and other electronic components.

SUMMARY OF THE INVENTION

The present invention is directed to methods of electrolessly plating a metal on a substrate comprising:

(a) coating the substrate with at least one layer of an ablatively-removable material;

(b) irradiating at least a portion of the coated layer with a sufficient amount of laser radiation to thereby ablatively remove the irradiated portions of the coated layer;

(c) coating the resulting irradiated substrate with a catalyst capable of instigating the electroless deposition of the metal to be plated when contacted by an electroless plating solution; and (d) contacting the catalyst-coated substrate with an electroless plating solution to plate the metal on the irradiated portion of the substrate and remove the unirradiated catalyst-coated layer.

The present invention is also directed to products produced by the above-described methods which are useful as electronic components including printed circuit boards, semiconductor devices and the like.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings in which:

DETAILED DESCRIPTION OF THE INVENTION

The present invention comprises a method of electrolessly plating a metal on a substrate. As shown in FIGS. 1(*a*)–1(*d*), substrate 2 is generally any substrate suitable for receiving thereon an electrolessly plated metal coating, or which can have thereon an insulative layer which can receive the metal coating. It is preferred that the substrate comprise a dielectric and/or microcircuit material. Suitable substrates include one or more of ceramics, polyimides, alumina, silicone-polyimides, silicon, silicone rubbers, silicon dioxide and the like. The substrate may also have thereon a metal pad which can be adapted to provide an interconnection between, for example, printed circuit patterns.

Figure 1A:
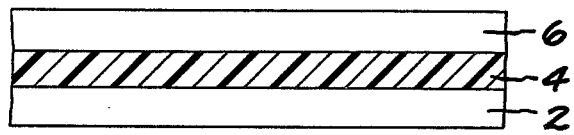
FIGS. 1(*a*)–1(*d*) are diagrammatic, sectional views showing sequential steps of one embodiment of the invention wherein metal is deposited on an insulative material covering the substrate.

As shown in FIG. 1(a), substrate 2 may be, optionally, coated with a layer of insulative material 4 when an interconnection between printed circuit patterns is not desired. Such insulative materials are known in the art and include, for example, insulative plastics such a polyimides, polysulfones, silicone polyimides, epoxies and Mylar. A water-soluble layer 6 is coated on insulative layer 4 and preferably comprises a water-soluble polymer. Suitable water-soluble polymers include polyvinylpyrrolidone, polyvinyl alcohol, gelatin and polyalkylene ethers. Polyvinyl pyrrolidone is particularly preferred. The water-soluble layer is coated at a thickness sufficient to insure complete coverage of the substrate, preferably from about 500Å to about 3000Å.

Figure 1B:
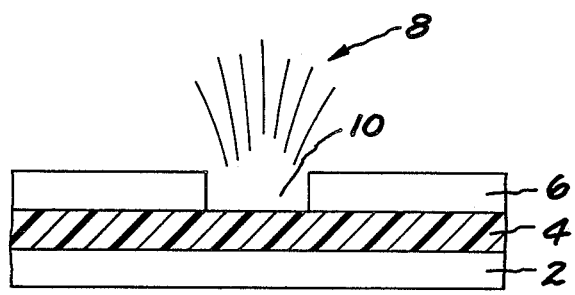

Referring to FIG. 1(b), the portion of the substrate to be plated is irradiated, as shown by reference numeral 8, with radiation from an excimer laser (not shown) such as one employing a noble gas/halide gas mixture (e.g., argon-fluorine gas mixture) to break apart the carbon-carbon bonds of the water-soluble polymer to thereby ablatively remove water-soluble polymer layer 6 and form a metal deposition target area 10.

The excimer laser, e.g. a Lambda Physik excimer laser, is operated in the ultraviolet region, preferably at a wavelength of about 193 nm, 248 nm or 308 nm at a fluence (energy level) in the range of at least about 20 mJ/cm$^2$, preferably 20 mJ/cm$^2$ to 300 mJ/cm$^2$.

Figure 1C:
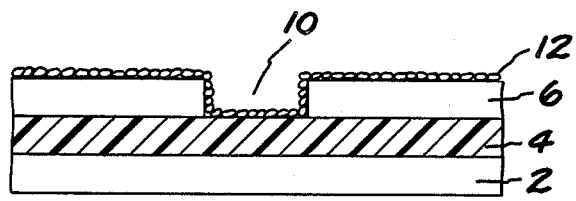

After ablation, the remaining unirradiated water-soluble polymer layer 6 and target area 10 are coated with a catalyst 12 capable of instigating the plating of metal contained in the electroless plating solution, as shown in FIG. 1(c). The catalyst is preferably selected from compounds containing palladium, nickel or platinum. Palladium-containing compounds are particularly preferred. Examples of palladium-containing compounds include bis benzonitrile palladium chloride, palladium acetate, palladium bromide, palladium chloride, palladium iodide, palladium nitrate, palladium 1,1,1,5,5,5,-hexafluoro-2,4-pentanedionate, palladium 2,4-pentanedionate, palladium trifluoroacetate and elemental palladium. Elemental palladium may be applied to the ablated substrate by conventional techniques such as evaporation and chemical sputtering.

The amount of the catalyst used to cover the substrate must be sufficient to instigate the deposition of a uniform layer of metal in those areas where deposition is required.

Figure 1D:
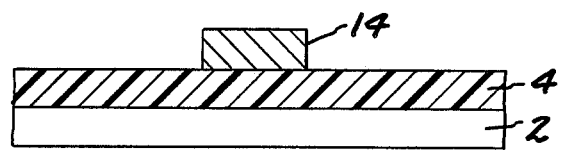

The substrate, thus activated by catalyst 12, is then contacted with the electroless plating solution to deposit a layer of metal 14 in activated target area 10. At the same time, the unirradiated remaining portion of water-soluble polymer layer 6 having catalyst 12 thereon is rinsed away in the plating solution. As a result, the metallized substrate shown in FIG. 1(d) is produced. It is also within the scope of the present invention to remove the unirradiated portion of water-soluble polymer layer 6 in a separate aqueous bath after activation with catalyst 12.

Virtually any metal may be plated in accordance with the present invention. Preferred metals include copper, palladium, nickel, cobalt and iron. Copper is especially preferred for electronic applications because of its excellent conductive properties. Furthermore, the metal may be plated to any thickness by employing well-known plating baths or by first forming a layer of metal in accordance with the invention and then plating thereover by conventional plating techniques.

Figure 2A:
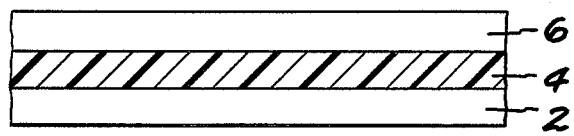
FIGS. 2(*a*)–2(*d*) are diagrammatic, sectional views showing sequential steps of another embodiment of the invention wherein metal is deposited directly on the substrate.
Figure 2B:
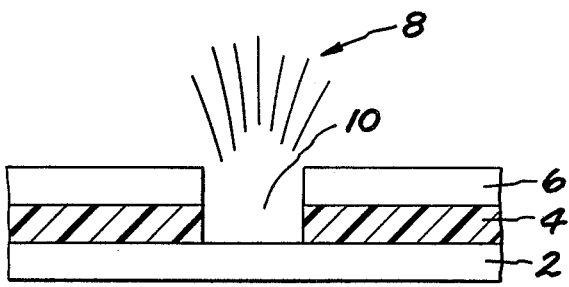
Figure 2C:
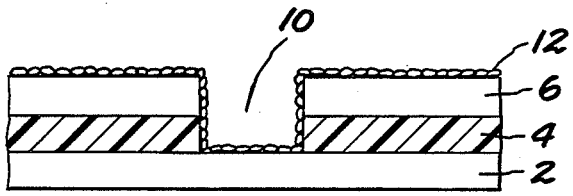
Figure 2D:
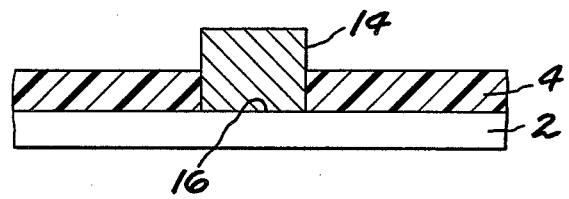

In another embodiment of the invention as shown in FIGS. 2(a)-2(d), both water-soluble polymer layer 6 and insulative layer 4 are ablatively removed, as indicated by reference numeral 8 (see FIG. 2(b)). The remaining structure is then activated with catalyst, as indicated in FIG. 2(c), and treated with the electroless plating solution to thereby form in target area 10 a metal layer 14, as shown in FIG. 2(d) and, at the same time, to remove the unirradiated portion of catalyst-coated water-soluble polymer layer 6. The embodiment shown in FIGS. 2(a)-2(d) is especially suited for forming a conductive interconnection between printed circuit units. In this event, surface 16 of substrate 2 is provided with a metal pad embedded in the substrate. The metal pad may be made from such conductive metals as aluminum, chromium, molybdenum and the like.

In still another embodiment of the invention an organic soluble layer is positioned between the insulative material and the water-soluble polymer to provide additional protection against unwanted plating in the unirradiated regions.

Figure 3A:
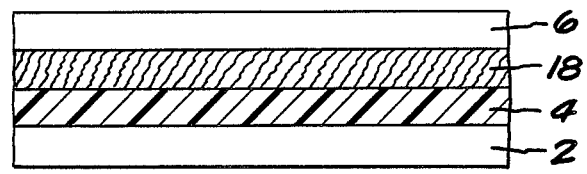
FIGS. 3(*a*)–3(*f*) are diagrammatic, sectional views showing sequential steps of another embodiment of the invention wherein an organic soluble layer is interposed between the insulative layer on the substrate and a water-soluble polymer layer.
Figure 3B:
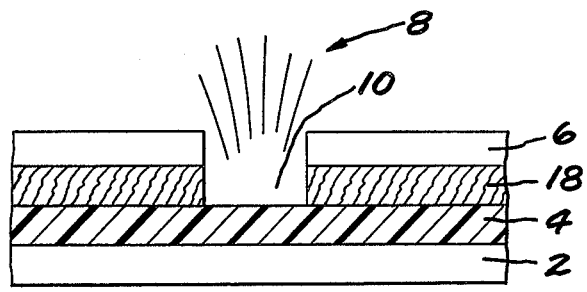
Figure 3C:
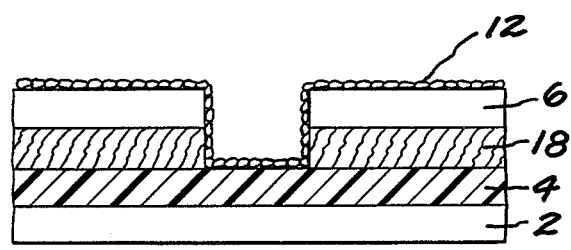
Figure 3D:
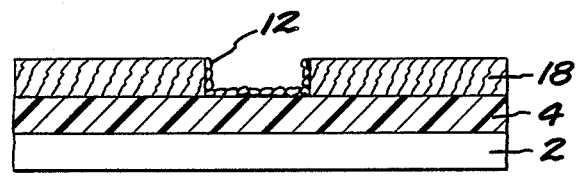
Figure 3E:
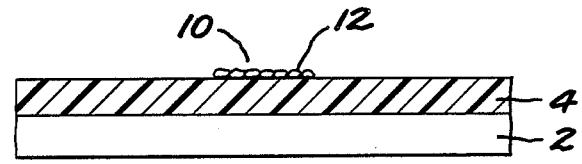
Figure 3F:
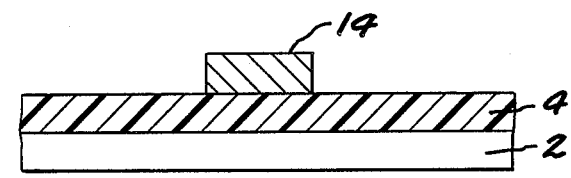

Referring to FIGS. 3(a)-3(f), an organic soluble layer 18 such as polyvinylacetate, polystyrene, or polymethylmethacrylate is coated over insulative layer 4, dried and then coated with water-soluble polymer 6. Insulative layer 4 is thus coated with a dual layer. Ablation by an excimer laser is performed as described previously to ablate the desired portion of water-soluble polymer layer 6 and a corresponding portion of organic soluble layer 18, as shown in FIG. 3(b). A layer of catalyst 12 is then applied to the substrate as shown in FIG. 3(c). The remaining portion of water-soluble polymer layer 6 having catalyst 12 thereon is then rinsed away, as indicated in FIG. 3(d), in an aqueous bath, and is followed by removal of the remaining organic soluble layer 18 in an organic solvent, such as toluene or xylene, leaving the structure shown in FIG. 3(e). The resulting substrate, activated only in target area 10, is then immersed in a plating solution to produce the desired metallized substrate as shown in FIG. 3(f). It is alternatively possible to immerse the activated substrate in a plating bath to thereby simultaneously remove the unablated portions of water-soluble layer 6 and organic soluble layer 18, while plating the metal in target area 10.

Figure 4A:
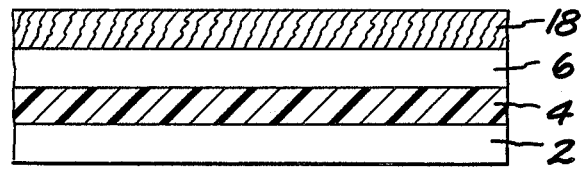
FIGS. 4(*a*)–4(*f*) are diagrammatic, sectional views showing sequential steps of another embodiment of the invention wherein a water-soluble layer is interposed between the insulative layer and a topmost layer of an organic soluble material.
Figure 4B:
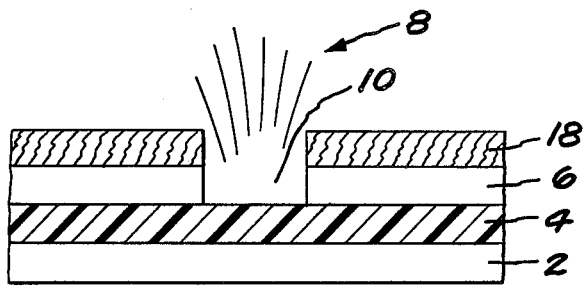
Figure 4C:
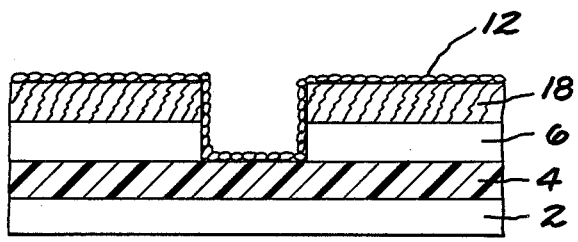
Figure 4D:
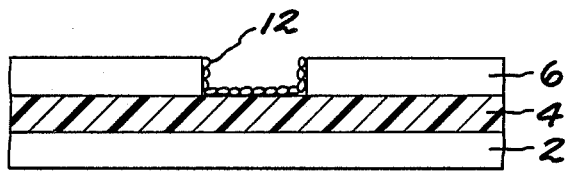

The position of water-soluble layer 6 and organic soluble layer 18 in the dual layer coated on insulative layer 4 may be reversed, and the process according to the present invention conducted as shown in FIGS. 4(a)-4(f). More specifically, both organic soluble layer 18 and water-soluble layer 6 are ablated, as indicated in FIG. 4(b), and activated, as indicated in FIG. 4(c). The remaining portion of organic soluble layer 18 is then removed, as indicated in FIG. 4(d), by solvent washing. To insure that target area 10 remains properly activated, it is desirable to select a catalyst (e.g., elemental palladium) which is substantially insoluble in the solvent.

Figure 4E:
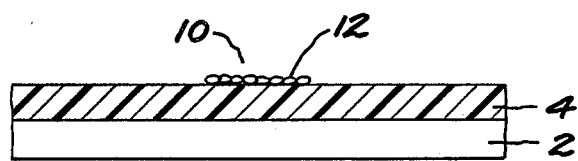
Figure 4F:
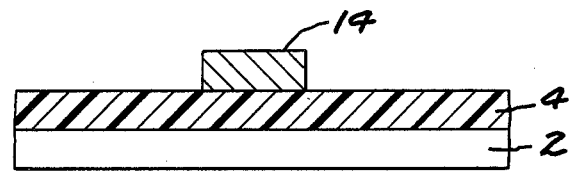

The remaining portion of water-soluble layer 6 is then washed away, leaving the substrate activated solely in target area 10, as shown in FIG. 4(e). The resulting activated substrate is then immersed in a plating bath to plate a metal layer 14 solely on target area 10, resulting in the structure shown in FIG. 4(f). Alternatively, removal of unablated portions of organic soluble layer 18 and water-soluble layer 6 can occur simultaneously by immersing the activated substrate in the plating solution.

The following examples are for illustrative purposes only and are not meant to limit the invention as encompassed by the claims appended hereto.

EXAMPLE 1

A commercially available polyimide (Pyralin 2540, DuPont Chemical) was spin coated on a 2"×2" quartz slide. The sample was baked for 1 hour at 120° C. and for an additional 30 minutes at about 250° C. until the polyimide was cured. A 2% by weight solution of polyvinylpyrrolidone (Aldrich Chemical) in methanol was prepared and spin coated on the surface of the polyimide layer and then dried. The polyvinylpyrrolidone coated sample was then baked for 5 minutes at 100° C. to remove trace amounts of solvent. The thickness of the resulting polyvinylpyrrolidone layer was 1,000Å.

The sample was then exposed to a Lambda Physik excimer laser operating at 193 nm with a 12 ns pulse duration. A series of small spots and a line were written into the water-soluble layer at an energy fluence of 20 mJ/cm$^2$. The spots were given from 1 to 10 pulses. The line was written by moving the sample manually and irradiating at a rate of 5 pulses per second. As a result of exposure, the polyvinylpyrrolidone layer was removed from the irradiated area. The sample was then dipped in a 1% by weight solution of bis benzonitrile palladium chloride in toluene for 5 minutes. The activated substrate was blown dry and then immersed in an electroless copper bath (sold by Enthone Corporation under the name Enplate CU-402) at room temperature for 2 minutes. The sample was then removed from the bath and rinsed in water. The area of the sample which had been exposed to the excimer laser coated a bright film of copper. The unirradiated regions did not have a metallized layer thereon because the water-soluble protective coating washed off in the plating bath.

EXAMPLE 2

A sample was prepared in an identical manner as in Example 1. The sample was then exposed to the Lambda Physik excimer laser operating at 248 nm with a 12 ns pulse. The sample was irradiated through a metal line mask at an energy fluence of about 100 mJ/cm$^2$. After exposure, the sample was activated with evaporated palladium and electrolessly plated as described in Example 1. Fine lines of copper appeared in the irradiated regions. Copper plating did not take place in the unirradiated regions.

EXAMPLE 3

A microscope slide was coated with polyvinylpyrrolidone to a thickness of 1000 Å from a 2% by weight solution in methanol. The sample was irradiated as described in Example 2. Thereafter, the sample was dipped in palladium acetate, dried and then immersed in an electroless copper bath (Metex 9620) available from MacDermid, Incorporated for 2 minutes at 60° C. The irradiated regions plated a bright copper and the unirradiated regions were void of copper.

EXAMPLE 4

A sample was prepared, irradiated and activated as in Example 1 by spin coating with a 0.5% by weight solution of palladium acetate in acetone. The sample was then dipped in the water to wash away the polyvinylpyrrolidone in the unexposed regions. This resulted in the palladium catalyst being present only in the irradiated regions. The sample was then dipped in an Enplate CU-402 bath for 2 minutes at room temperature. A bright copper layer plated in the irradiated regions.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A method of electrolessly plating a metal on a substrate comprising:
   (a) coating the substrate with at least one layer of an ablatively-removable material to form a coated substrate;
   (b) irradiating at least a portion of the coated substrate with a sufficient amount of laser radiation to thereby ablatively remove the irradiated portion of the layer coated on the substrate;
   (c) terminating the step of irradiating at least a portion of the coated substrate;
   (d) coating the resulting irradiated substrate with a catalyst capable of instigating electroless deposition of the metal to be plated when contacted by an electroless plating solution; and
   (e) contacting the catalyst-coated substrate with an electroless plating solution to thereby plate the metal on the catalyst-coated irradiated portion of the substrate and simultaneously remove the unirradiated portion of the catalyst-coated layer.

2. The method of claim 1 wherein the electrolessly plated metal is selected from the group consisting of copper, palladium, nickel, cobalt and iron.

3. The method claim 2 wherein the electrolessly plated metal comprises copper.

4. The method of claim 1 wherein the catalyst is selected from the group consisting of palladium-containing compounds, nickel-containing compounds and platinum-containing compounds.

5. The method of claim 1 wherein said catalyst is selected from the group consisting of bis benzonitrile palladium chloride, palladium acetate, palladium bromide, palladium chloride, palladium iodide, palladium nitrate, palladium 1,1,1,5,5,5-hexafluoro-2,4-pentanedionate, palladium 2,4-pentanedionate, palladium trifluoroacetate and elemental palladium.

6. The method of claim 1 wherein the ablatively-removable material comprises a water-soluble polymer.

7. The method of claim 6 wherein the water-soluble polymer is selected from the group consisting of polyvinylpyrrolidone, polyvinyl alcohol, gelatin and polyalkylene ethers.

8. The method of claim 6 wherein the water-soluble polymer comprises polyvinylpyrrolidone.

9. The method of claim 1 wherein step (b) further comprises irradiating at least a portion of the coated substrate with laser radiation in the far to near ultraviolet region at a fluence of at least about 20 mJ/cm$^2$.

10. The method of claim 9 wherein the rate of fluence is from about 20 mJ/cm$^2$ to about 300 mJ/cm$^2$.

11. The method of claim 9 wherein the laser comprises an excimer laser.

12. The method of claim 9 wherein the wavelength of the laser radiation is selected from the group of wavelengths consisting of 193 nm, 248 nm and 308 nm.

13. The method of claim 1 wherein the substrate comprises one of the group consisting of polyimides, alumina, ceramics, silicone-polyimides, polysulfones, silicon, silicone rubbers and silicon dioxide.

14. The method of claim 1 wherein the substrate includes a metal layer in the irradiated portion of the substrate, the plated metal being deposited on the metal layer to thereby provide a low loss means of electrically interconnecting the substrate and another electronic component.

15. The method of claim 1 wherein the substrate includes a layer of insulative material thereon and the layer of ablatively-removable material is coated on the insulative layer.

16. The method of claim 15 wherein step (b) comprises irradiating at least a portion of the ablatively-removable layer and the corresponding portion of the insulative layer in registry therewith, with said laser radiation to thereby ablatively remove the irradiated portion of the coated, ablatively-removable layer and corresponding irradiated portion of the insulative layer.

17. The method of claim 1 wherein the substrate is non-planar.

18. The method of claim 1 wherein the at least one layer of ablatively-removable material includes an organic soluble layer.

19. The method of claim 18 wherein the organic soluble layer comprises one of the group consisting of polyvinylacetate, polystyrene and polymethylmethacrylate.

20. The method of claim 18 wherein the substrate includes a layer of insulative material thereon and the at least one layer of ablatively-removable material is coated on the layer of insulative material.

21. A method of electrolessly plating copper on a substrate comprising:
    (a) coating the substrate with a layer consisting essentially of a water-soluble polymer;
    (b) irradiating at least a portion of the water-soluble polymer layer with a sufficient amount of laser radiation from an excimer laser to thereby ablatively remove said irradiated portions of the water-soluble polymer layer;
    (c) terminating the step of irradiating at least a portion of the water-soluble polymer layer;
    (d) coating with a palladium catalyst the surface of the substrate thus ablatively exposed; and
    (e) contacting the substrate and the water-soluble polymer layer thereon with an electroless copper solution to thereby plate copper on the catalyst-coated portion of the substrate and simultaneously remove the unirradiated portion of the palladium catalyst-coated water-soluble polymer layer.

22. The method of claim 21 wherein said water soluble polymer comprises polyvinylpyrrolidone.

23. The method of claim 21 wherein the energy fluence of the radiation employed to ablatively remove portions of the water-soluble polymer layer is from about 20 mJ/cm$^2$ to about 300 mJ/cm$^2$.

24. The method of claim 21 wherein the substrate includes a layer of insulative material thereon and the water-soluble polymer layer overlies the insulative layer.

25. The method of claim 24 wherein step (b) comprises irradiating with laser radiation at least a portion of the water-soluble polymer layer and the corresponding portion of the insulative layer in registry therewith, to thereby ablatively remove the irradiated portion of the water soluble polymer layer and the corresponding irradiated portion of the insulative layer.

26. A method of electrolessly plating a metal on a substrate, said substrate including thereon a dual layer comprising an organic soluble material and a water-soluble polymer layer, said method comprising:
    (a) irradiating at least a portion of the water-soluble polymer layer and a corresponding portion of the organic soluble layer in registry therewith, with a sufficient amount of laser radiation to thereby ablatively remove the irradiated portion of the water-soluble polymer layer and the corresponding portion of the organic soluble layer;
    (b) terminating the step of irradiating at least a portion of the water-soluble polymer layer and a corresponding portion of the organic soluble layer in registry therewith;
    (c) coating the surface of the substrate, thus ablatively exposed, with a catalyst capable of instigating electroless deposition of the metal to be plated when the ablatively-exposed substrate surface is contacted by an electroless plating solution; and
    (d) contacting the catalyst-coated substrate with an electroless plating solution to thereby plate the metal on the ablatively-exposed substrate surface and simultaneously remove the unirradiated catalyst-coated dual layer.

27. The method of claim 26 wherein the water-soluble polymer layer is situated between the organic soluble layer and the substrate.

28. The method of claim 26 wherein the organic soluble layer is situated between the water-soluble polymer layer and the substrate.

29. The method of claim 14 wherein the metal layer comprises one of the group consisting of aluminum chromium and molybdenum.

* * * * *